United States Patent [19]

Schmidt et al.

[11] 4,055,391
[45] Oct. 25, 1977

[54] CRUCIBLE

[75] Inventors: Walter Schmidt; Walter Stählin, both of Schaffhausen, Switzerland

[73] Assignee: Prolizenz AG, Chur, Switzerland

[21] Appl. No.: 661,433

[22] Filed: Feb. 26, 1976

[30] Foreign Application Priority Data

June 11, 1975 Switzerland .......................... 7518/75

[51] Int. Cl.² .......................... F27B 14/10; F27R 14/00
[52] U.S. Cl. .................................... 432/264; 432/156; 432/265
[58] Field of Search ............... 432/262, 264, 156, 265; 13/30, 35

[56] References Cited

U.S. PATENT DOCUMENTS

| 1,838,357 | 12/1931 | Bottrill | 432/263 X |
| 1,895,421 | 1/1933 | Northrup | 13/35 X |
| 2,665,223 | 1/1954 | Clough et al. | 432/264 |
| 3,470,017 | 9/1969 | Rubin et al. | 432/264 |
| 3,491,992 | 1/1970 | Reichelt | 432/265 |

FOREIGN PATENT DOCUMENTS 726,993  3/1968  France ................................. 432/156

Primary Examiner—John J. Camby
Attorney, Agent, or Firm—Ernest F. Marmorek

[57] ABSTRACT

A crucible, especially for containing melts, has a multi-chamber construction wherein there is an outer chamber for containing a heat distribution medium and an inner chamber which acts as a receptacle for the melt.

11 Claims, 5 Drawing Figures

CRUCIBLE

CROSS-REFERENCE TO RELATED APPLICATIONS

This application is related to my applications Ser. Nos. 661,438 and 661,439 filed on Feb. 26, 1976, to my application Ser. No. 664,700 filed on Mar. 5, 1976, and to application Ser. No. 661,434 filed on Feb. 26, 1976 by Werner J. Borer et al.

BACKGROUND OF THE INVENTION

The invention relates to a crucible having an inner chamber surrounded by an outer chamber. The outer chamber is for a heat distribution medium while the inner chamber forms a receptacle for the melt. The chambers do not have direct liquid communication between them. More particularly, the instant invention relates to a crucible especially adapted for containing a melt for drawing crystals in particular single crystals according to Czochralski process.

A requirement for such a crucible is that it be resistant to attack by the high melting point melts normally used in the Czochralski and other similar processes, as well as that it be resistant to oxygen or oxidizing substances at high temeratures normally encountered.

Crucibles normally used for this purpose are composed of a platinum metal; for example iridium, with a melting point of 2,454° C, has been found particlarly useful. In general, a melt is prepared in an iridium crucible at about 1800° C and thereafter a seed crystal is introduced. The seed crystal is slowly withdrawn from the melt under controlled conditions of temperature and withdrawal velocity, and a cylindrical crystal is thereby formed on the seed crystal.

The disadvantage of conventional iridium crucibles lies in their relatively short useful life and the high cost of replacing or remaking the iridium crucible. Iridium is expensive and must be processed at temperatures in the order of 1200° C.

The short usable life of the iridium crucible is a result of corrosion by the melt, which becomes progressively more rapid as the surface area of the inside of the crucible increases due to the roughening effect of corrosion.

The rate of corrosion is highly dependent on the temperature of the crucible. Corrosion rates increase with increasing temperature. As it is common to heat such crucibles by means of high frequency induction coils, the problem of corrosion is increased due to hot spots or uneven temperature gradients which occur across the normally non-homogeneous crucible as a result of heating by induction.

When the corrosion progresses to the point that the crucible can no longer function properly, the crucible is subjected to reprocessing: the iridium content of the crucible is reclaimed and remolded into a new crucible. As noted above, the iridium can be processed only at a temperature of about 1200° C and the cost of replacing the iridium lost by corrosion is high.

Desirable features for a crucible include a crucible which minimizes the losses of expensive iridium or other material.

SUMMARY OF THE INVENTION

One of the principal objects of the invention is to provide a crucible which results in a lower rate of corrosion of iridium or other material used in crucibles to contain hot melts for use, especially, in crystal growing.

Further objects and advantages of the invention will be set forth in part in the following specification and in part will be obvious therefrom without being specifically referred to, the same being realized and attained as pointed out in the claims hereof, certain embodiments of the same being illustrated in the accompanying drawings and described in the specification.

With the above and other objects of the invention in view the invention consists in the novel construction, arrangement and combination of various elements and parts, as set forth in the claims hereof, certain embodiments of the same being illustrated in the accompanying drawings and described in the specifications.

In general, the invention comprises an inner chamber of receptacle for receiving the melt, which receptacle is formed of a material resistant to reaction with the melt, for example iridium. An outer chamber is disposed around the inner chamber and is filled with a heat distribution medium. The heat distribution medium attenuates the effects of uneven heating of the outer encircling wall on the inner wall by distributing the heat more evenly. The heat distribution medium is a material which is liquid at the temperatures at which the crucible is intended to be used and is less corrosive or chemically reactive than the melt. Thus, the outer crucible wall, which is subjected to hot spots or uneven heating, is in contact with a less corrosive material while the inner crucible wall iridium is subjected to more even heating due to the buffering effect of the melted heat distribution medium and especially convection currents set up therein. The melt crucible is thus hollow walled and the hollow walls of the crucible contain a substantially non-reactive heat transfer substance having a melting point above 1500° C and a boiling point above about 1750° C.

The invention accordingly comprises the features of construction, combination of elements and arrangement of parts which will be exemplified in a construction hereinafter set forth and the scope of the application which will be indicated in the claims.

BRIEF DESCRIPTION OF THE DRAWINGS

For a fuller understanding of the nature and objects of the invention, reference should be had to the following detailed description taken in connection with the accompanying drawings, in which.

DESCRIPTION OF THE PREFERRED EMBODIMENTS

In carrying the invention into effect some embodiments have been selected for illustration in the accompanying drawings and for description in the specification, reference is had to FIGS. 1A, 1B, 2A, 2B and 3.

Figure 1A:
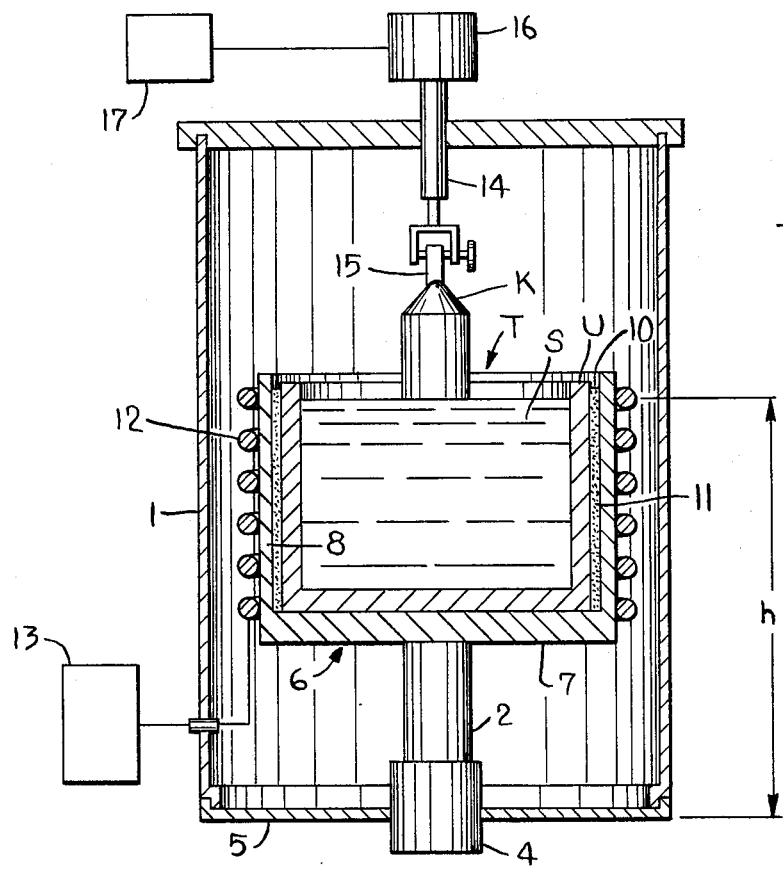
FIG. 1A is a vertical sectional view of a part of a crystal drawing device including a crucible according to the instant invention.
Figure 1B:
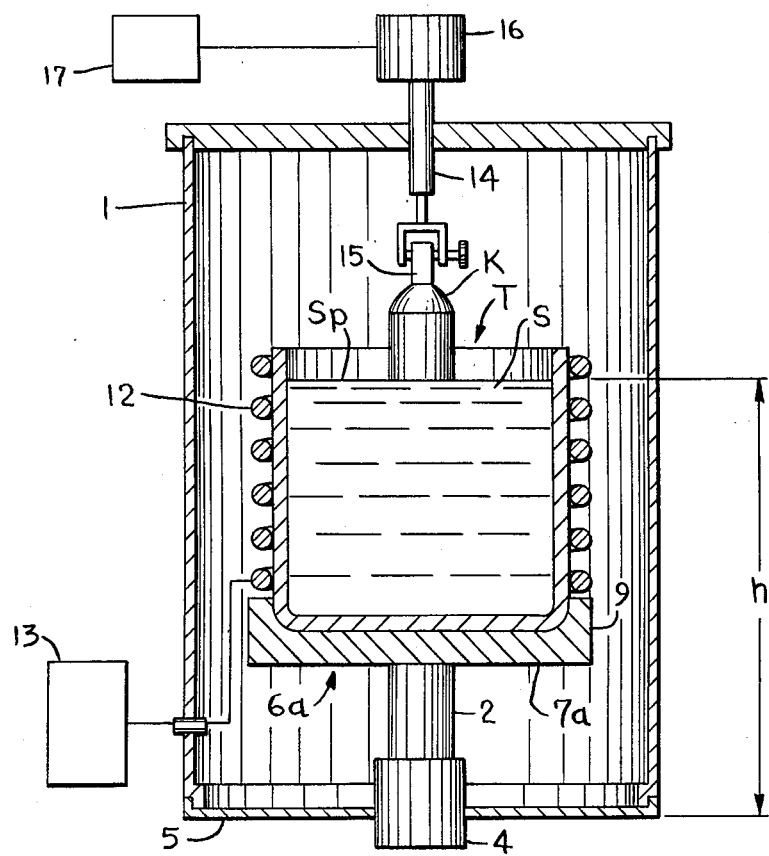
FIG. 1B is a vertical sectional view of a part of another crystal drawing device including a crucible according to the instant invention.

Generally, FIGS. 1A and 1B show a device for growing a single crystal according to the Czochralski process. A housing 1 encloses a supporting device 6,6a. A shaft 2 supports the supporting device 6,6a and can be vertically displaced by a member 4 so that the level "Sp" of a melt "S" in the crucible "T" is kept a constant distance "h" from the bottom surface 5 of the housing 1. FIG. 1A shows the supporting device 6 that includes a bottom plate 7 and an insulating outer encircling wall 8, which together form an outer body whereas the embodiment of FIG. 1B shows the supporting device 6a including a bottom plate 7a with an annular flange 9.

In FIG. 1A the wall "U" and insulating wall 8 defines an annular region 10 which is filled with powdered aluminum oxide 11. Heat is generated by a high-frequency induction coil 12 connected to a high-frequency generator 13. The inner wall U defines an inner chamber that contains the melt. The inner wall U separates the annular region 10 and inner chamber to prevent direct liquid communication between said chambers.

A seed crystal 15 extends from a vertical drawing-rod 14 in the melt S and is slowly withdrawn by a drawing member 16 with the formation of a crystal "K". The drawing member 16 is operated by a control device 17.

Figure 2A:
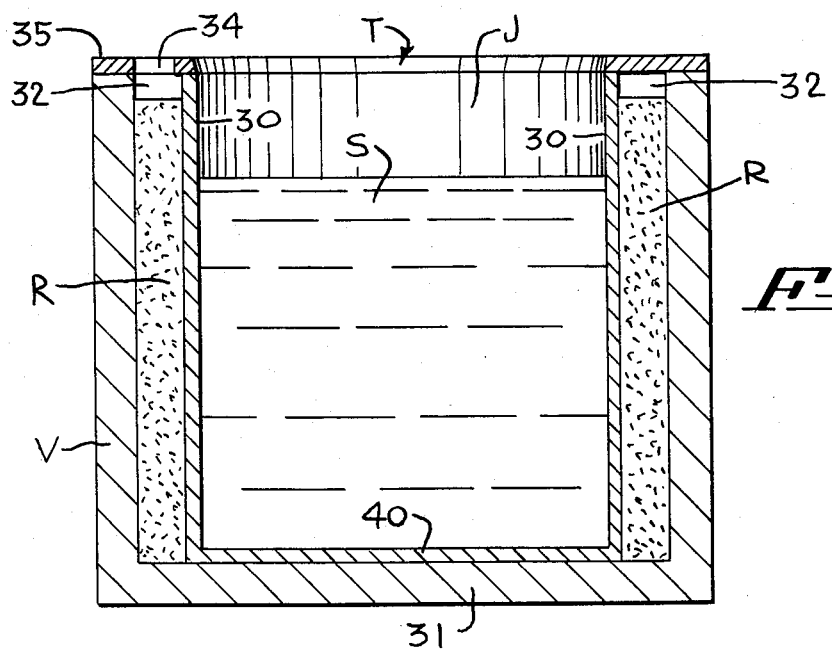
FIG. 2A is a vertical sectional view of an embodiment of a crucible according to the instant invention.
Figure 2B:
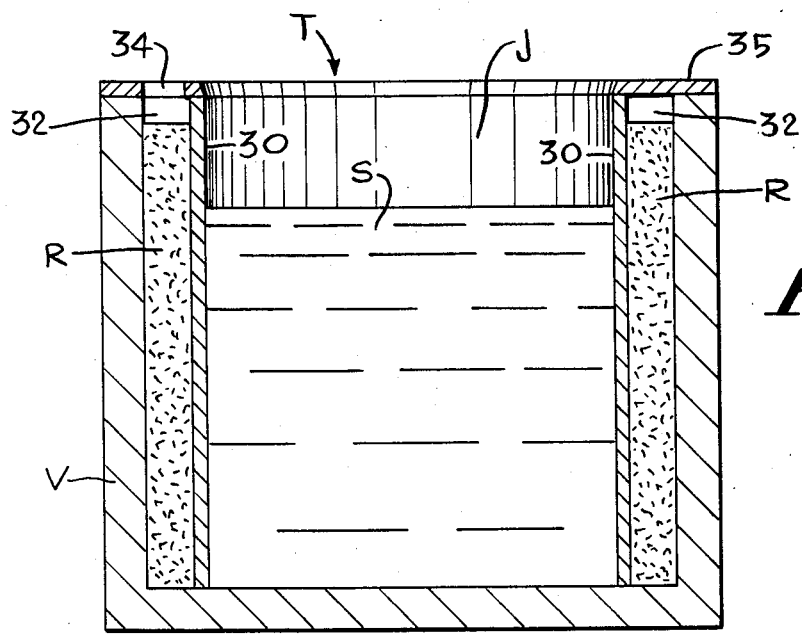
FIG. 2B is a vertical sectional view of a modified embodiment of a crucible according to the instant invention.

FIGS. 2A and 2B show a crucible T with an outer wall V and an inner wall 30 that divides the crucible T into an outer chamber 32 and an inner chamber J. Inner crucible wall 30 separates outer chamber 32 from inner chamber J and prevents liquid communication between said chambers. A condensation wall or cover 35 may be provided to retard losses of material heated in the outer chamber 32 of the crucible. This cover is preferably provided with openings 34 to permit introduction or removal of material from the outer chamber 32 of the crucible. In FIG. 2A, the outer walls and the bottom plate are composed of the same material.

The outer chamber 32 of the crucible T is at least partially filled with a substance R, the heat distribution medium, that has a melting point which is below the melting point of the melt S. The substance R should also have a boiling point above the melting point of the melt S to retard excessive losses of the substance R. When a melt S comprising, for example, gadolinium-gallium-garnet that has a melting point of about 1750° C, is to be used, a heat distribution medium such as a substance R that is composed of a mixture of silicates, for example anorthite, wollastonite or a mixture of these with melting points of about 1500° to 1600° C has been found particularly advantageous.

In the embodiment shown in FIG. 2A, the inner wall 30 includes an integral bottom plate 40. The bottom plate 40 is shown supported by a slab or bottom portion 31 of the outer wall V of the crucible T.

Figure 3:
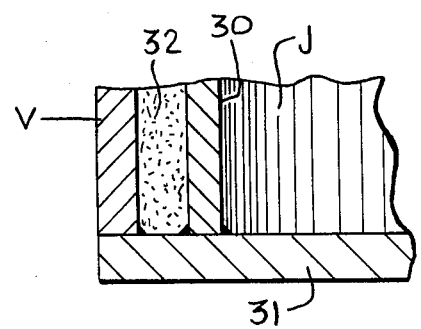
FIG. 3 is a fragmentary sectional view similar to FIG. 2B, but embodying a further modification.

The embodiment shown in FIG. 3 is similar to that of FIG. 2B except that the crucible is formed in three parts V, 30 and 31. The bottom portion is designated 31 and two coaxial cylindrical walls V and 30, that are spaced apart from each other, are secured to the bottom plate 31. The bottom plate 31 extends below both of these walls V and 30. This embodiment has the advantage of being less costly to manufacture as it does not require deep drawing or other similar methods to produce the crucible.

Operation

The operation of the above described embodiments is as follows:

A heat distribution medium such as a substance R that has a melting point preferably lower than that of the melt S is contained in the outer chamber 32. Although it is difficult or impossible to prevent uneven heating in the outer wall V of the crucible, the presence of the melted heat distribution medium substance R disposed between the inner wall 30 and the outer wall V retards uneven heating of the inner wall 30.

By using a substance R which is relatively non-reactive with respect to the melt S, the accelerated effects of corrosion due to hot spots or uneven heating, is attenuated. Uneven heating of the inner wall 30 is reduced due to mixing of the melted substance R, for example by diffusion or by convection currents.

In use, a crucible according to the instant invention permits heating a material S contained in the inner chamber without any localized overheating, which is unavoidable in prior art crucibles.

In order to reduce the amount of loss of material being heated in the crucible, a cover 35 is provided. Openings 34 in the cover 35 permits filling of the outer chamber of. The cover 35 acts to condense vapors that may escape from the heat distribution medium.

It should be understood that it is not desired to be limited to the exact details of construction shown and described, for obvious modifications will occur to a person skilled in the art.

Having thus described the invention, what is claimed as new and desired to be secured by Letters Patent, is as follows:

1. A crucible, for use in heating a melt,
   comprising in combination,
   an outer wall and an inner wall of iridium defining an inner chamber to receive said melt;
   said outer and inner walls defining therebetween an outer chamber operable to receive a heat distribution medium at least partially filling said outer chamber and having a melting point above about 1500° C and which is below the melting point of said melt and a boiling point above about 1750° C which is above the melting point of said melt, said inner body separating said chambers preventing direct liquid communication between said chambers.

2. A crucible, as claimed in claim 1 wherein said heat distribution medium is a silicate with a melting point from about 1500° C to about 1600° C.

3. A crucible, as claimed in claim 2, wherein said medium comprises anorthite.

4. A crucible, as claimed in claim 2, wherein said medium comprises wollastonite.

5. A crucible, as claimed in claim 1, further comprising a cover means operable to close at least partially the top of said outer chamber.

6. A crucible, as claimed in claim 5, said cover means having at least one opening for filling or removing material from said outer chamber.

7. A crucible, as claimed in claim 1,
   said outer wall comprising an outer substantially cylindrical tube;
   said inner wall comprising an inner substantially cylindrical tube of smaller diameter than said outer tube and being disposed within and spaced apart from said outer wall; and
   a bottom plate, said cylindrical tubes being secured in liquid tight manner to said bottom plate to form said outer chamber.

8. A crucible, as claimed in claim 7, said outer wall and said bottom plate comprising the same material.

9. A Czochralski crystal-pulling apparatus wherein the melt crucible is hollow-walled and the walls of said crucible contain a substantially non-reactive heat transfer substance having a melting point above about 1500° C and a boiling point above about 1750° C, said crucible being a crucible according to claim 1.

10. Apparatus according to claim 1, wherein the space between said walls is sufficient to permit convection currents to flow therein.

11. Apparatus according to claim 1, wherein said heat transfer substance is a melted substance.

* * * * *